United States Patent
Moon et al.

(10) Patent No.: US 10,336,936 B2
(45) Date of Patent: Jul. 2, 2019

(54) PHOSPHOR AND LIGHT EMITTING DEVICE HAVING THE SAME

(71) Applicant: LG INNOTEK CO., LTD., Seoul (KR)

(72) Inventors: Ji Wook Moon, Seoul (KR); Woo Seuk Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/063,165

(22) PCT Filed: Dec. 16, 2016

(86) PCT No.: PCT/KR2016/014828
§ 371 (c)(1),
(2) Date: Jun. 15, 2018

(87) PCT Pub. No.: WO2017/105143
PCT Pub. Date: Jun. 22, 2017

(65) Prior Publication Data
US 2019/0002761 A1     Jan. 3, 2019

(30) Foreign Application Priority Data
Dec. 18, 2015 (KR) .................. 10-2015-0182149

(51) Int. Cl.
*C09K 11/57* (2006.01)
*H01L 33/52* (2010.01)
(Continued)

(52) U.S. Cl.
CPC ............ *C09K 11/576* (2013.01); *C09K 11/57* (2013.01); *H01L 33/504* (2013.01);
(Continued)

(58) Field of Classification Search
CPC .............................. C09K 11/576; H01L 33/52
(Continued)

(56) References Cited

U.S. PATENT DOCUMENTS 7,462,983 B2    12/2008   Baroky et al.
2005/0224828 A1   10/2005   Oon et al.
(Continued)

FOREIGN PATENT DOCUMENTS

EP            2 549 330       1/2013
KR    10-2004-0070870      8/2004
(Continued)

OTHER PUBLICATIONS

International Search Report (with English Translation) and Written Opinion dated Apr. 6, 2017 issued in Application No. PCT/KR2016/014828.

*Primary Examiner* — Igwe U Anya
(74) *Attorney, Agent, or Firm* — Ked & Associates, LLP (57) ABSTRACT

A phosphor and a light emitting device comprising the same are disclosed in embodiments. The phosphor disclosed in an embodiment comprises a phosphor composition of a $M_4D_{1-x}O_yF:A_x$ structure containing a divalent metal (M), an elements (A) of the active agent, a fluorine or fluor (F) and an oxygen (O), and, wherein the x satisfies a range of $0.001 \leq x \leq 0.1$, and the y satisfies a range of $1 \leq y \leq 5$, wherein the M is at least one of Mg, Ca, Sr, Ba and Zn, wherein the D is at least one of Si, Ge, Sn, Ti, Zr and Hf, wherein the F is fluorine, wherein the A comprises at least one of Mn, Ce, Pr, Nd, Sm, Eu, Tb, Dy, Ho, Er, Tm, and Yb, wherein the phosphor composition emits red light by a peak wavelength of 400 nm to 470 nm as an excitation wavelength, wherein the red light has a peak wavelength of 655 nm to 670 nm and has a FWHM of less than 20 nm.

15 Claims, 6 Drawing Sheets

(51) Int. Cl.
    *H05B 33/14*     (2006.01)
    *H01L 33/50*     (2010.01)
    *H01L 33/62*     (2010.01)

(52) U.S. Cl.
    CPC ............ *H01L 33/507* (2013.01); *H01L 33/52* (2013.01); *H01L 33/62* (2013.01); *H05B 33/14* (2013.01)

(58) Field of Classification Search
    USPC .......................................................... 257/98
    See application file for complete search history.

(56) References Cited

U.S. PATENT DOCUMENTS

| | | | |
|---|---|---|---|
| 2006/0126326 A1* | 6/2006 | Ng | F21K 9/00 362/231 |
| 2006/0232725 A1* | 10/2006 | Chua | B82Y 10/00 349/71 |
| 2007/0205712 A1 | 9/2007 | Radkov et al. | |
| 2010/0051974 A1* | 3/2010 | Krames | H01L 33/504 257/89 |
| 2010/0314993 A1 | 12/2010 | Im et al. | |
| 2015/0162506 A1 | 6/2015 | Lee et al. | |

FOREIGN PATENT DOCUMENTS

| | | |
|---|---|---|
| KR | 10-2011-0042126 | 4/2011 |
| KR | 10-2012-0039631 | 4/2012 |
| KR | 10-2015-0046377 | 4/2015 |
| KR | 10-2015-0067588 | 6/2015 |

\* cited by examiner

PHOSPHOR AND LIGHT EMITTING DEVICE HAVING THE SAME

CROSS-REFERENCE TO RELATED PATENT APPLICATIONS

This application is a U.S. National Stage Application under 35 U.S.C. § 371 of PCT Application No. PCT/KR2016/014828, filed Dec. 16, 2016, which claims priority to Korean Patent Application No. 10-2015-0182149, filed Dec. 18, 2015, whose entire disclosures are hereby incorporated by reference.

TECHNICAL FIELD

An embodiment relates to a phosphor and a light emitting device having the same. The light emitting device may be included in the illumination system.

BACKGROUND ART

A light emitting device is a device in which electric energy is converted into light energy. For example, a light emitting diode (LED) can realize various colors by controlling a composition ratio of a compound semiconductor. For example, nitride semiconductors have received great interest in optical devices and high power electronic devices due to their high thermal stability and wide bandgap energy. In particular, a blue light emitting device, a green light emitting device, and an ultraviolet (UV) light emitting device and the like using a nitride semiconductor are commercially available and widely used.

LED that emits white light is a method of using a secondary light source which emits light from a phosphor by applying a phosphor, and a method of obtaining a white light by applying a YAG:Ce phosphor that emits yellow to a blue LED is generally used. However, this method is disadvantageous in that the efficiency due to quantum deficits and re-emission efficiency generated by using the secondary light is accompanied and color rendering is not easy.

Therefore, a conventional white LED backlight is a combination of a blue LED chip and a yellow phosphor, and is limited in the extent that it can be used for a screen of a mobile phone or a notebook PC because green and red components are lacking to represent unnatural colors. Nevertheless, it is widely commercialized because of its advantages of being easy to drive and remarkably inexpensive.

The use of a white LED device made of a blue chip and a yellow phosphor is for a backlight used in a mobile phone, a personal digital assistant or the like. However, due to the use of yellow phosphors (e.g., the peak emission appears between 550 nm and 610 nm), the spectrum of the LED contains excessive emission in the yellow region of this spectrum, which strongly reduces the color gamut of the backlight.

The color gamut is an area spanned between chromaticity points of the red, green, and blue pixels of the display in chromaticity, e.g., CIE 1931 x, y chromaticity. The historical "golden standard" of the display is the NTSC gamut, which is limited to a set of three color coordinates. In general, a full range exceeding 70% of NTSC is considered acceptable for many backlighting applications, and a full range exceeding 90% of NTSC is considered acceptable for most of these optional uses.

When the entire range of the LED backlight is improved by using the yellow phosphor, the yellow light is removed, thereby reducing the brightness of the LED backlight.

Therefore, it would be beneficial to develop a white LED that can increase the brightness without using a yellow phosphor in the package.

Although the CRI is commonly referred to as the General Color Rendering Index and is abbreviated as Ra, although it is internationally specified that 14 of standard color samples are internationally available and can calculate a wider CRI R1-R14 as their mean value, is generally defined as the average value of color samples R1-R8. Specifically, a R9 value for measuring the color rendering property against a strong red color is very important for various applications, particularly in lighting and medical fields requiring a high color rendering index.

DISCLOSURE

Technical Problem

The embodiment provides a phosphor for wavelength conversion into red light.

The embodiment provides a red phosphor having a narrow full width at half maximum.

The embodiment provides a red phosphor and a light emitting device including the red phosphor.

Embodiments provide a phosphor that absorbs ultraviolet or blue excitation wavelengths and emits red light of 650 nm or more, and a light emitting device having the same.

The embodiment provides a light emitting device having a red phosphor, a green chip or a green phosphor and a blue light emitting chip.

Technical Solution

A phosphor according to the embodiment comprises: a phosphor composition of a $M_4D_{1-x}O_yF:A_x$ structure containing a divalent metal (M), an elements (A) of the active agent, a fluorine or fluor (F) and an oxygen (O), and, wherein the x satisfies a range of $0.001 \leq x \leq 0.1$, and the y satisfies a range of $1 \leq y \leq 5$, wherein the M is at least one of Mg, Ca, Sr, Ba and Zn, wherein the D is at least one of Si, Ge, Sn, Ti, Zr and Hf, wherein the F is fluorine, wherein the A comprises at least one of Mn, Ce, Pr, Nd, Sm, Eu, Tb, Dy, Ho, Er, Tm, and Yb, wherein the phosphor composition emits red light by a peak wavelength of 400 nm to 470 nm as an excitation wavelength, wherein the red light has a peak wavelength of 655 nm to 670 nm and has a FWHM of less than 20 nm.

A phosphor according to an embodiment comprises; a structure of composition of $Mg_4Ge_{1-x}O_yF:Mn^{4+}_x$, wherein the x satisfies a range of $0.001 \leq x \leq 0.1$, and the y satisfies a range of $1 \leq y \leq 5$, wherein the composition has a peak wavelength of 655 nm to 670 nm, and has a FWHM of less than 20 nm.

A light emitting device according to an embodiment includes: a light emitting chip; a light emitting chip; a first phosphor that emits light of the first peak wavelength by a light emitted from the light emitting chip as an excitation wavelength; a second phosphor that emits light from the second peak wavelength by the light emitted from the light emitting chip as an excitation wavelength, wherein the first and second peak wavelengths have a different color, wherein the second phosphor includes a phosphor composition of a $M_4D_{1-x}O_yF:A_x$ structure containing a divalent metal (M), an elements (A) of the active agent, a fluorine or fluor (F) and an oxygen (O), and, wherein the x satisfies a range of $0.001 \leq x \leq 0.1$, and they satisfies a range of $1 \leq y \leq 5$, wherein the M is at least one of Mg, Ca, Sr, Ba and Zn, wherein the D is at least one of Si, Ge, Sn, Ti, Zr and Hf, wherein the F is fluorine, wherein the A comprises at least one of Mn, Ce, Pr, Nd, Sm, Eu, Tb, Dy, Ho, Er, Tm, and Yb, wherein the second peak wavelength emitted from the second phosphor has a peak wavelength of a of 400 nm to 470 nm and has a FWHM of less than 20 nm.

Advantageous Effects

According to the embodiment, it is possible to provide a novel phosphor and a light emitting device having a combination of these.

The color reproducibility can be improved by using the red phosphor according to the embodiment.

According to the embodiment, it is possible to provide a light emitting device having an improved color rendering index (CRI) and improved R9.

Embodiments can provide a phosphor and a light emitting device including the same.

BEST MODE

The embodiments may be modified in other forms or various embodiments may be combined with each other, and the scope of the present invention is not limited to each embodiment described below. Although the description in the specific embodiments is not described in the other embodiments, other embodiments may be understood as being related to the other embodiments unless otherwise described or contradicted by those in the other embodiments. For example, if the features for configuration A are described in a particular embodiment and the features for configuration B are described in another embodiment, even if the embodiment in which configuration A and configuration B are combined is not explicitly described, It is to be understood that they fall within the scope of the invention.

Hereinafter, embodiments of the present invention capable of realizing the above objects will be described with reference to the accompanying drawings. In the description of embodiments according to the present invention, in the case of being described as being formed "on or under" of each element, the on (upper) or under (lower) or under are all such that two elements are in direct contact with each other or one or more other elements are indirectly formed between the two elements. Also, when expressed as "on or under", it may include not only an upward direction but also a downward direction with respect to one element. In addition, standards for top, bottom, or bottom of each layer will be described with reference to the drawings.

The phosphor according to the embodiment is a red phosphor that contains a divalent metal (M), an active agent element (A), fluorine (F) and oxygen (O) and has a structure of the general formula $M_4D_{1-x}O_yF:A_x$ or a composition having a composition formula of $M_4D_{1-x}O_yF:A_x$. Wherein M is at least one of Mg, Ca, Sr, Ba and Zn and D is at least one of Si, Ge, Sn, Ti, Zr and Hf, F is Fluorine, A is Mn, Ce, Pr, Nd, Sm, Eu, Tb, Dy, Ho, Er, Tm, Yb. The x satisfies $0.001 \leq x \leq 0.1$, and y can satisfy $1 \leq y \leq 5$. When the element D increases from 0.01 to 0.99, the element A can be reduced from 0.99 to 0.01. The element A of the activator may be a tetravalent transition metal ion such as $Mn^{4+}$, or a metal ion selected from various rare-earth ions or transition metal ions. For example, a trivalent rare earth ions such as $Eu^{2+}$, $Ce^{3+}$, $Pr^{3+}$, $Nd^{3+}$, $Sm^{3+}$, $Eu^{3+}$, $Gd^{+3}$, $Tb^{3+}$, $Dy^{3+}$, $Ho^{3+}$, $Er^{3+}$, $Tm^{3+}$, $Yb^{3+}$, a divalent rare earth metal ions such as $Sm^{2+}$, $Eu^{2+}$, $Yb^{2+}$ and a transition metal ions such as $Cr^{3+}$ or $Fe^{3+}$.

Figure 8:
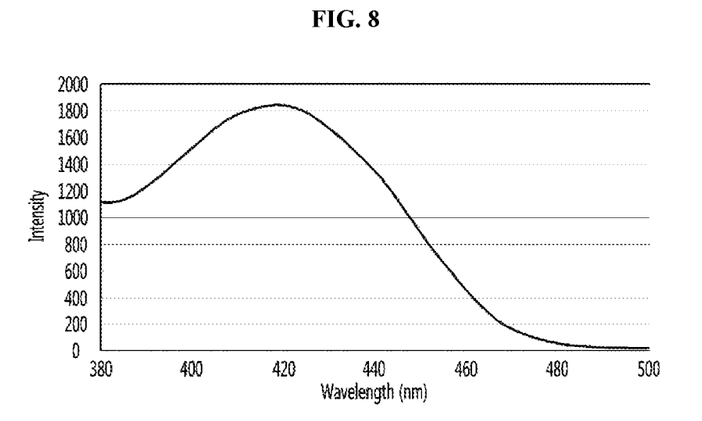
FIG. 8 is a view showing an example of the excitation wavelength of the phosphor or the wavelength of the light emitting chip according to the embodiment.
Figure 9:
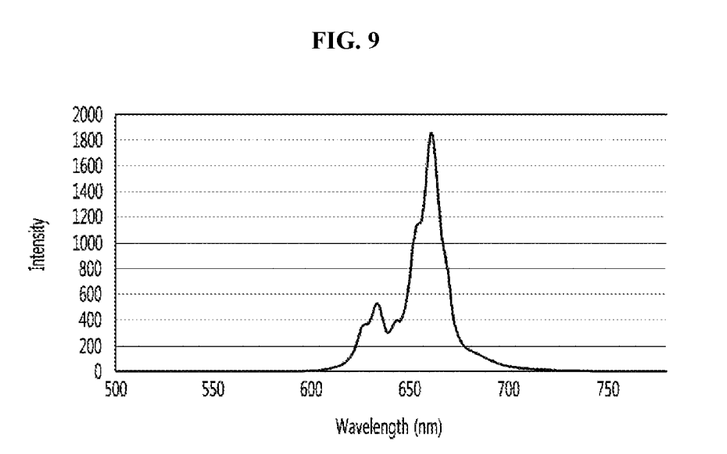
FIG. 9 is a view showing a wavelength spectrum of a red phosphor according to an embodiment.
Figure 10:
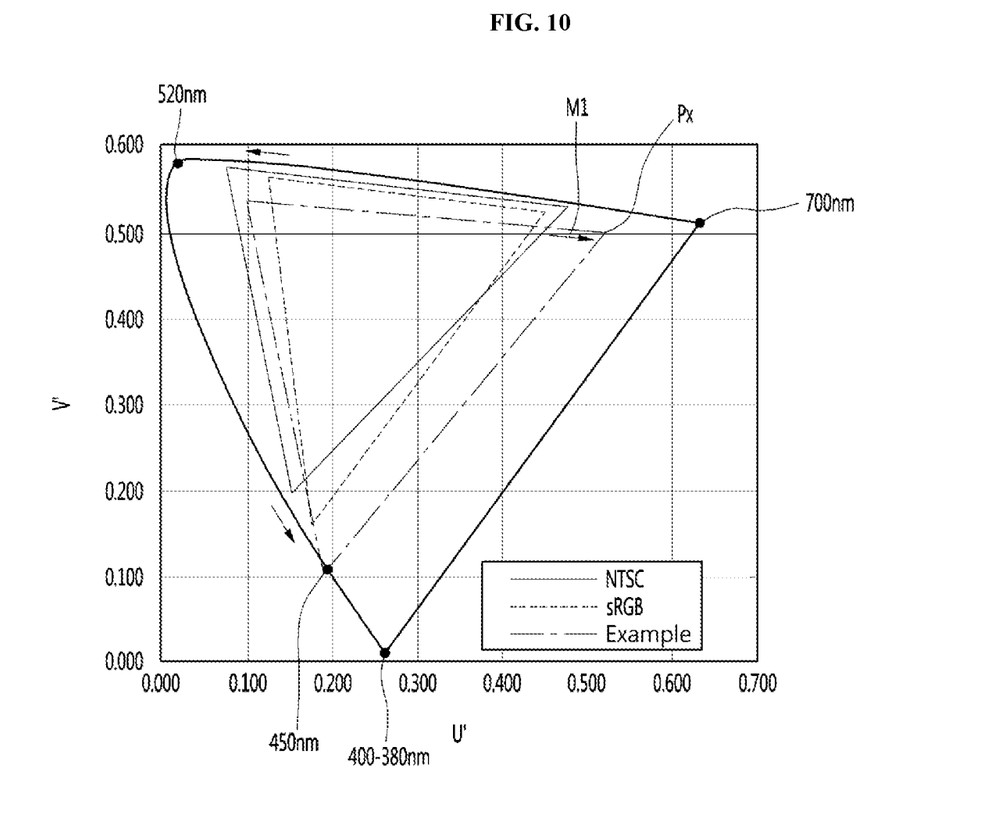
FIG. 10 is a diagram showing the color coordinates of CIE 1976 by light emitted from a light emitting device having a red phosphor according to an embodiment.

The red phosphor may emit a peak wavelength having a long wavelength in a deep red color, for example, a red wavelength, using an ultraviolet or blue wavelength as an excitation wavelength. As shown in FIG. 8, the red phosphor can emit a red peak wavelength with a peak wavelength of 400 nm or more, for example, 400 nm to 470 nm as an excitation wavelength. As shown in FIG. 9, the red phosphor may emit a peak wavelength of 650 nm or more, for example, 655 nm to 670 nm. The full width at half maximum (FWHM) of the peak wavelength of the red phosphor may be 25 nm or less, for example, 20 nm or less. The FWHM (full width at half maximum) of the peak wavelength of the red phosphor may be, for example, in the range of 10 nm to 20 nm. When the peak wavelength of the light emitted from the red phosphor is lower than the above range, the reproduction of the high color is insignificant, so that there is a limit to improve the NTSC. If the FWHM of the peak wavelength of the light emitted from the red phosphor is larger than the above range, the improvement of the area ratio of NTSC and sRGB may be insignificant. The embodiment provides a phosphor composition having a peak wavelength of a red wavelength and a narrow FWHM, thereby improving the color reproducibility of red as shown in FIG. 10 and improving the area ratio of NTSC and sRGB.

As a specific example, the composition of the red phosphor may be used as a fluorine phosphor material activated with $Mn^{4+}x$. The composition of the red phosphor may have a structure or a composition formula of, for example, $Mg_4Ge_{1-x}O_yF:Mn^{4+}x$ wherein the x satisfies $0.001 \leq x \leq 0.1$, and y can satisfy $1 \leq y \leq 5$. Such a red phosphor can emit a peak wavelength of 650 nm or more, for example, 655 nm to 670 nm as shown in FIG. 9, with the excitation wavelength of the ultraviolet or blue wavelength being an excitation wavelength, for example, a peak wavelength of 400 to 470 nm as shown in Fig. The full width at half maximum (FWHM) of the peak wavelength of the red phosphor may be 25 nm or less, for example, 20 nm or less. The FWHM of the peak wavelength of the red phosphor may be, for example, in the range of 10 nm to 20 nm. Since the red phosphor having the structure or the composition formula of $Mg_4Ge_{1-x}O_yF:Mn^{4+}_x$ has a peak wavelength of a long wavelength in a red wavelength and a full width at half maximum is 25 nm or less, red color purity can be further improved.

The embodiment can provide a light emitting device including a light emitting chip having a peak wavelength of 400 nm to 470 nm and a red phosphor emitting a peak wavelength of 655 nm to 670 nm by the light emitting chip. Since the embodiment does not use the red light emitting chip, the Bin management point can be reduced, the yield can be increased, and the advantageous effect can be obtained in the case of using the multi-light emitting chip. Further, since the red light emitting chip is not used, the change in color temperature can be reduced and stable optical characteristics can be provided.

An embodiment provides a light emitting device including a light emitting chip having a peak wavelength of 400 nm to 470 nm, a green phosphor emitting green light by the light of the light emitting chip, and a red phosphor according to an embodiment emitting a peak wavelength of 655 nm to 670 nm. An embodiment provides a light emitting device including a light emitting chip having a peak wavelength of 400 nm to 470 nm, a green light emitting chip emitting green light, and a red phosphor according to an embodiment emitting a peak wavelength of 655 nm to 670 nm. The light emitting device of the embodiment can be realized as a white light emitting device.

Figure 1:
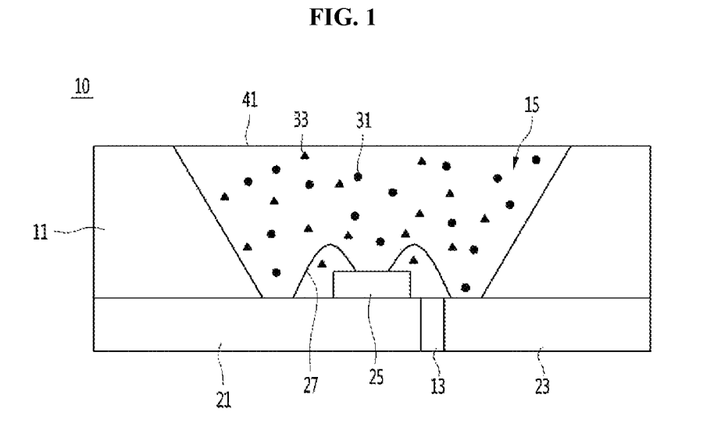
FIG. 1 is a sectional view of a light emitting device including a red phosphor according to an embodiment.

A light emitting device having a red phosphor according to an embodiment will be described. 1 is a cross-sectional view showing a light emitting device having a phosphor according to an embodiment.

Referring to FIG. 1, the light emitting device 10 includes a body 11, a plurality of lead frames 21 and 23, a light emitting chip 25, and a molding member 41 having phosphors 31 and 33.

The body 11 may be formed of a material having a reflectivity higher than that of the light emitted by the light emitting chip 25, for example, a material having a reflectance of 70% or more. When the reflectance of the body 11 is 70% or more, the body 11 may be defined as a non-transparent material. The body 11 may be formed of a resin-based insulating material, for example, a resin material such as Polyphthalamide (PPA). The body 11 may be formed of a metal oxide such as epoxy or silicon, and the metal oxide may include at least one of $TiO_2$, $SiO_2$, and $Al_2O_3$.

The body 11 includes a silicone-based, epoxy-based, or plastic material, and may be formed of a thermosetting resin or a material having high heat resistance and high light resistance. In the body 11, an acid anhydride, an antioxidant, a release agent, a light reflector, an inorganic filler, a curing catalyst, a light stabilizer, a lubricant, and titanium dioxide may be selectively added. For example, the body 110 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride, or 4-methyl hexahydro phthalic anhydride, and then partially hardening the mixture through heating after adding DBU(1,8-diazabicyclo(5,4,0)undecene-7) serving as a hardening accelerator and ethylene glycol, titanium oxide pigment or glass fiber serving as a promoter to the epoxy resin, but the embodiment is not limited thereto.

A light shielding material or a diffusing agent may be mixed in the body 11 to reduce the transmitted light. In order to have a predetermined function, the body 11 may be formed by appropriately mixing at least one member selected from the group consisting of a diffusing agent, a pigment, a fluorescent substance, a reflective substance, a light shielding substance, a light stabilizer and a lubricant in a thermosetting resin.

As another example, the body 11 may be formed of a light-transmitting resin material or a resin material having a phosphor according to an embodiment for changing the wavelength of incident light. When the body 11 is formed of a light transmitting material, it may be a material through which light of 70% or more is transmitted through the light emitted from the light emitting chip 25. For example, the red phosphor disclosed in the embodiment may be added to the body 11.

The body 11 includes a cavity 15 which is recessed at a predetermined depth from an upper surface of the body 11 and is opened at an upper portion. The cavity 15 may be formed in the form of a concave cup structure, an open structure, or a recess structure, but is not limited thereto. The cavity 15 has a width that gradually increases as it goes up, so that light extraction efficiency can be improved.

A plurality of lead frames, for example, first and second lead frames 21 and 23, may be coupled to the body 11. The first and second lead frames 21 and 23 may be disposed on the bottom of the cavity 15 and the outer sides of the first and second lead frames 21 and 23 may be exposed to at least one side of the body 11 through the body 11. The lower portions of the first lead frame 21 and the second lead frame 23 may be exposed to a lower portion of the body 11 and may be mounted on a circuit board to receive power.

As another example of the first and second lead frames 21 and 23, at least one or both of the first and second lead frames 21 and 23 may be formed in a structure of a concave cup shape or a bending structure. At least one or both of the first and second lead frames 21 and 23 may include recessed grooves or holes for coupling with the body 11, but are not limited thereto. The light emitting chip 25 may be disposed in the concave cup shape, but the present invention is not limited thereto.

The first lead frame 21 and the second lead frame 23 may be formed of a metal material such as titanium (Ti), copper (Cu), nickel (Ni), gold (Au), chromium (Cr), tantalum (Ta), platinum (Pt), tin (Sn), silver (Ag), and phosphorous (P). The red phosphor according to the embodiment may be distributed on the bottom surface of the cavity 15, for example, on the upper surfaces of the first and second lead frames 21 and 23.

A light emitting chip 25 is disposed on the first lead frame 21 and the light emitting chip 25 can be bonded on the first lead frame 21 as an adhesion member. The light emitting chip 25 may be connected to at least one connecting member 27 of the first and second lead frames 21 and 23, but the present invention is not limited thereto. The connecting member 27 includes a wire made of a conductive material such as a metal.

The light emitting chip 25 emits a peak wavelength in the range of 400 nm to 600 nm in the wavelength range of the visible light. The light emitting chip 25 may emit ultraviolet or blue peak wavelengths. The light emitting chip 25 may emit a blue peak wavelength, for example, a peak wavelength in the range of 400 nm to 470 nm as shown in FIG. 8.

The light emitting chip 25 may include at least one of a compound semiconductor of a group II-VI element and a compound semiconductor of a group III-V element. The light emitting chip 25 may be formed of a compound selected from the group consisting of GaN, AlGaN, InGaN, AlInGaN, GaP, AlN, GaAs, AlGaAs, InP and mixtures thereof. At least one semiconductor layer constituting the light emitting chip 25 is formed of a compound semiconductor having a composition formula of $Al_xIn_yGa_{(1-x-y)}N$ ($0 \leq x \leq 1$, $0 \leq y \leq 1$, $0 \leq x+y \leq 1$).

A molding member 41 is disposed in the cavity 15 and the molding member 41 includes phosphors 31 and 33 according to an embodiment of the present invention. The phosphors 31 and 33 include phosphors having mutually different materials emitting different peak wavelengths. The phosphors 31 and 33 include, for example, a first phosphor 31 and a second phosphor 33 that emit different peak wavelengths. The first phosphor 31 may include one or more kinds of phosphors. For example, the first phosphor may emit a first peak wavelength with the peak wavelength emitted from the light emitting chip 25 as an excitation wavelength. The first peak wavelength may include, for example, green light. The first phosphor 31 may include a green phosphor. The green phosphor may emit a peak wavelength of 525 nm to 545 nm.

The first phosphor 31 may be selected, for example, one kind or two or more from among $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N11$:Ce, $\alpha$-SiAlON:Eu, $\beta$-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4C_{12}$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu, and $3.5MgO \cdot 0.5MgF_2 \cdot GeO_2$:Mn, etc.

The first phosphor 31 may include, for example, at least one among $La_3Si_6N_{11}$:Ce$^{3-}$, $BaSiN_2$:Eu$^{2-}$, $Sr_{1.5}Al_3Si_9N_{16}$:Eu$^{2+}$, $Ca_{1.5}Al_3Si_9N_{16}$:Eu$^{2+}$, $CaSiAl_2O_3N_2$:Eu$^{2-}$, $SrSiAl_2O_3N_2$:Eu$^{2+}$, $CaSi_2O_2N_2$:Eu$^{2+}$, $SrSi_2O_2N_2$:Eu$^{2+}$, $BaSi_2O_2N_2$:Eu$^{2+}$, $Sr_2Si_5N_8$:Ce$^{3+}$, and $Ca_{1-5}Al_3Si_9N_{16}$:Ce$^3$.

The first phosphor 31 may include a quantum dot, and the quantum dot may include an II-VI compound or an III-V compound semiconductor, and may emit green light. The quantum dots include, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, Si, $CuInS_2$, $CuInSe_2$, etc and combinations thereof. The first phosphor 31 having the quantum dots can emit green light.

The second phosphor 33 emits a peak wavelength of a long wavelength within a second peak wavelength, for example, a red peak wavelength according to an embodiment, by using the light emitted from the light emitting chip 25 as an excitation wavelength. The second phosphor 33 includes the red phosphor according to the embodiment. The red phosphor includes a composition containing a divalent metal (M), an element (A), a fluorine (F), a fluorine or fluorine (F) and oxygen (O) and having the general formula $M_4D_{1-x}O_yF:A_x$. Wherein M is at least one of Mg, Ca, Sr, Ba and Zn and D is at least one of Si, Ge, Sn, Ti, Zr and Hf, F is Fluorine, A is Mn, Ce, Pr, Nd, Sm, Eu, Tb, Dy, Ho, Er, Tm, Yb. Here, M is Mg, D is Ge, and A may include Mn$^{4+}$. The molar percentage of A is 10% or less, and the sum of the molar percentages of D and A may be 100%. X satisfies $0.001 \leq x \leq 0.1$, and y can satisfy $1 \leq y \leq 5$. When the element D increases from 0.01 to 0.99, the element A can be reduced from 0.99 to 0.01.

The second phosphor 33 emits in a deep red color, for example, a long wavelength of a red wavelength, using the ultraviolet or blue wavelength emitted from the light emitting chip 25 as an excitation wavelength. The deep red color may be red with a wavelength close to 700 nm. The second peak wavelength emitted from the second phosphor 33 may emit a peak wavelength of 650 nm or more, for example, a peak wavelength of 655 nm to 670 nm or a peak wavelength of 660 nm to 665 nm as shown in FIG. 9. The FWHM of the peak wavelength of the second phosphor 33 may be 25 nm or less, for example, 20 nm or less. The FWHM of the peak wavelength of the second phosphor 33 may range, for example, from 10 nm to 20 nm. As an example of a specific spherical body, the composition of the red phosphor may be used as a fluorine phosphor material activated with Mn$^{4+}$x. The composition of the red phosphor may have a structure or a composition formula of, for example, $Mg_4Ge_{1-x}O_yF$:Mn$^{4+}$x. When the peak wavelength of the light emitted from the red phosphor is lower than the peak wavelength range, the high color reproduction is insignificant, so there is a limitation in improving NTSC. Further, when the FWHM of the light emitted from the red phosphor is larger than the above range, the improvement of the area ratio of NTSC and sRGB may be insignificant. The embodiment provides a phosphor composition having a red peak wavelength of a long wavelength and a narrow FWHM and improves the color reproducibility. As shown in FIG. 10, the phosphor composition has a ratio of 120% or more with respect to the area ratio of the NTSC color region and 130%.

Here, as a comparative example, a white light is realized by using a blue light emitting chip and a yellow phosphor as a light emitting device using the same color conversion as a white light emitting device. For example, when a blue light emitting device is used as a reference light source and blue light emitted from the blue light emitting device is projected onto a YAG (Yttrium Aluminum Garnet) phosphor as a yellow phosphor, the yellow phosphor is excited by the incident light to emit light Emits light in a wavelength band of 500 nm to 780 nm, and white light can be emitted by the mixed color of these lights. However, in this example, since the wavelength intervals of blue and yellow are wide, a scintillation effect due to color separation can be caused. Also, it is not easy to control the same color coordinates, color temperature, and color rendering index, and color conversion phenomenon may occur depending on the ambient temperature. Particularly, when the backlight unit is fabricated using the light emitting device, the color reproduction ratio with respect to NTSC is limited up to about 65%. On the other hand, the color reproduction rate may exceed 100% of NTSC by a method of implementing white light using a multi-chip using red, green, and blue light emitting devices. However, when the white color is implemented as a multi-chip in this manner, the operation voltage is uneven in each chip, and the output of the chip changes according to the ambient temperature, so that the color coordinates may change, and a driving circuit should be added. Also, when a red light emitting chip is used, a change in color coordinates caused by a red chip may be a problem depending on a current and a temperature, thereby changing the overall color coordinates of the backlight unit.

In the light emitting device 10 according to the embodiment, the blue light by the light emitting chip 25, the green light by the first phosphor 31, and the red light by the second phosphor 33 may be mixed with each other, and the mixed light may be emitted as white light. That is, a light emitting device which emits a white light can be provided.

The content ratio of the second phosphor 33 may be more than the content ratio of the first phosphor 31 in view of the ratio of the contents of the phosphors 31 and 33 in the molding member 41 according to the embodiment have. For example, the content of the first phosphor 31 may be in the range of 5% to 40%, and the content of the second phosphor 33 may be in the range of 60% to 95%. When the content ratio of the first phosphor 31 is less than the above range, red has a higher relative brightness than green, and when it is higher than the above range, green may have a higher relative brightness than red. When the content ratio of the second phosphor 33 is less than the above range, green has a higher relative brightness than red, and when it is higher than the above range, red has a higher relative brightness than green. When the content ratio of the first and second phosphors 31 and 33 is out of the above range, improvement of color purity of green or red is insignificant in NTSC, sRGB and BT2020 and the like, and reproduction of high color may be difficult. When the sum of the content ratios of the first and second phosphors 31 and 33 is 100%, the content ratio of the first and second phosphors 33 may be in the range described above.

The total weight of the phosphors in the molding member 41 may be 70 wt % or more, for example, 70 wt % to 150 wt %. When the total weight of the phosphors 31 and 33 is less than the above range, the blue color distribution may be increased and when the total weight of the phosphors 31 and 33 is larger than the above range, the blue color distribution may be decreased.

In the light emitting device 10 of the embodiment, u'=0.51 to 0.53 and v'=0.48 to 0.51 in the red point Px in the u' and v' chromaticity diagrams of CIE 1976 shown in FIG. 10, green is u'=0.08 To 0.11 and v'=0.52 to 0.54, and the blue color is in the range of u'=0.17 to 0.20 and v'=0.08 to 0.12. The color coordinates of the red light are in an area surrounded by four vertexes (0.5100, 0.4800), (0.5100, 0.5100), (0.5300, 0.4900), (0.5300, 0.5055) 0.0900, 0.5200), (0.0850, 0.5250), (0.1100, 0.5250), (0.1050, 0.5400). The red phosphor according to the embodiment can shift u' in the u', v' chromaticity diagram of CIE 1976 by 0.05 or more relative to NTSC. The red color of the red phosphor according to the embodiment is narrow in the FWHM and is distributed in the long wavelength, so that the color purity of red can be further widened. Accordingly, it is possible to have a color reproduction rate, particularly a more realistic red recall ratio, in NTSC, sRGB and the like. When the light emitting device according to the example of embodiment is applied to the LCD module, the area ratio in the CIE 1976 detected is 120% or more as compared with the NTSC color area and 130% or more as compared with the sRGB color area as a whole it can be done.

The light emitting device 10 according to the embodiment does not use a yellow phosphor and can improve the red color rendering index R9 and provide a red spectrum with a narrow FWHM so that a light having a high color rendering index can be produced.

The light emitting device 10 may further include a blue phosphor when the light emitting chip 25 is a UV light emitting chip, but the present invention is not limited thereto.

Each of the first and second phosphors 31 and 33 may be a particle that emits a unique color or may be provided in the form of a mixture of different fluorescent particles emitting two colors or three colors into one particle. The particle may be in a range of 40 μm or less, for example, in the range of 1 to 30 μm. If the size of the particle is smaller than the above range, distribution control is difficult.

The light emitting device according to the embodiment is a white light emitting device. The light emitting device according to the embodiment is a white light emitting device, and can be implemented in a device of a white color of 2500K-4000K, a cool white of 6500K-7000K, a neutral white of 3000-4000K, or pure white depending on the color temperature.

Figure 2:
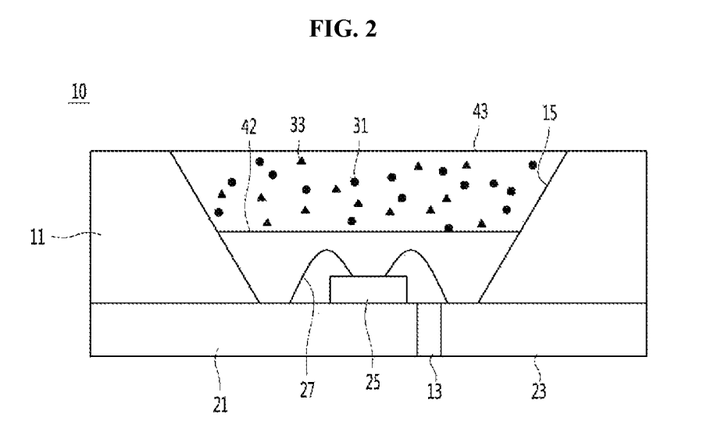
FIG. 2 is a view showing another example of a light emitting device having a red phosphor according to an embodiment.

FIG. 2 is a view showing another example of a light emitting device having a phosphor according to an embodiment. In describing FIG. 2, the same parts as FIG. 1 will be described with reference to FIG. 1.

Referring to FIG. 2, the light emitting device may include a plurality of molding members 42 and 43 in the cavity 15 of the body 11. The phosphors 31 and 33 may be disposed on any one of the molding members 42 and 43. The plurality of molding members 42 and 43 may include first and second molding members 42 and 43 and the phosphors 31 and 33 may be disposed on the second molding member 43. The ratio of the thickness of the first and second molding members 42 and 43 may be in the range of 2:1 to 1:3. When the thickness ratio of the second molding member 43 is smaller than the above range, and the thickness of the light emitting device 10 may be increased when the thickness is larger than the above range.

The phosphors 31 and 33 may be spaced apart from the light emitting chip 25. The second molding member 43 may have an interval of 0.2 mm or more from the light emitting chip 25, and if the interval is narrower than 0.2 mm, deterioration of the phosphor may occur. A phosphor, for example, any kind of phosphor may not be added to the first molding member 42 that is in contact with the light emitting chip 25. The first and second phosphors 31 and 33 may be added to the second molding member 43 disposed on the first molding member 42. Accordingly, damage to the first and second phosphors 31 and 33 due to heat generated from the light emitting chip 25 can be reduced.

The first molding member 42 and the second molding member 43 may include the same resin material such as silicone or epoxy. The characteristics of the first and second phosphors 31 and 33 will be described with reference to the description of the embodiment.

Figure 3:
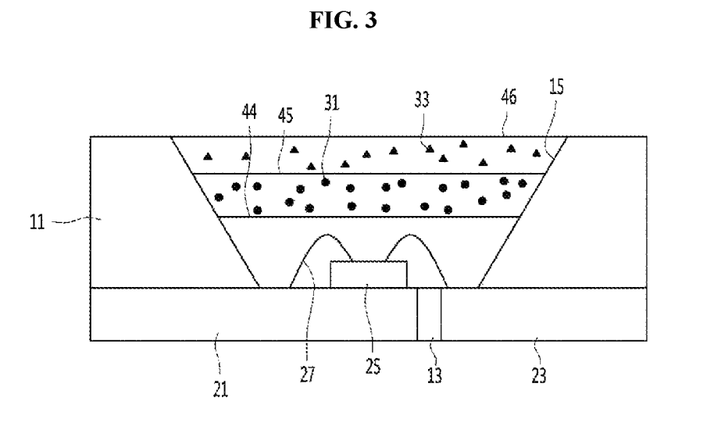
FIG. 3 is a view showing another example of a light emitting device having a red phosphor according to an embodiment.

FIG. 3 is a view showing another example of a light emitting device having a phosphor according to an embodiment. In describing FIG. 3, the same parts as those described above will be referred to the description given above.

Referring to FIG. 3, the light emitting device may include a plurality of molding members 44, 45, and 46 in the cavity 15 of the body 11. Different kinds of phosphors 31 and 33 may be added to at least two of the plurality of molding members 45 and 46.

The molding members 44, 45, and 46 may include a first molding member 44 on the cavity 15, a second molding member 45 on the first molding member 44 and a third molding member 46 on the second molding member 45. The first molding member 44 is in contact with the light emitting chip 25, and any kind of phosphor may not be added to the first molding member 44. The first phosphor 31 may be added to the second molding member 45 and the second phosphor 33 may be added to the third molding member 46.

The thickness ratio of the first to third molding members 44, 45, and 46 may be in the range of 2:1:1 to 3:1:1. The thickness of the second molding member 45 may be thicker or thinner than the thickness of the first molding member 44 and may be the same as or different from the thickness of the third molding member 46. If the ratio of the thickness of the first molding member 43 is smaller than the above range, the ability to disperse the transmitted heat may be deteriorated and heat may be transferred to the phosphor. If the ratio is larger than the above range, a thickness of the light emitting device 10 may become thick.

The first to third molding members 44, 45, and 46 may be made of the same light transmitting resin material or a resin material having a difference in refractive index, but the present invention is not limited thereto. The characteristics of the first and second phosphors 31 and 33 will be described with reference to the description of the embodiment.

As another example, when a plurality of molding members 44, 45 and 46 are disposed in the cavity 15, a phosphor having a low peak wavelength band among the first and second phosphors 31 and 33, for example, the first phosphor 31 May be added to the molding member at a lower position than the molding member to which the second phosphor 33 is added. On the contrary, when a phosphor having a high peak wavelength band among the first and second phosphors 31 and 33, for example, the second phosphor 33, is added to a molding member which is lower in position than the molding member to which the first phosphor 31 is added. Further, the third phosphors 31 and 33 may be distributed on the upper surface or the lower surface of the respective molding members 45 and 46, but the present invention is not limited thereto.

Figure 4:
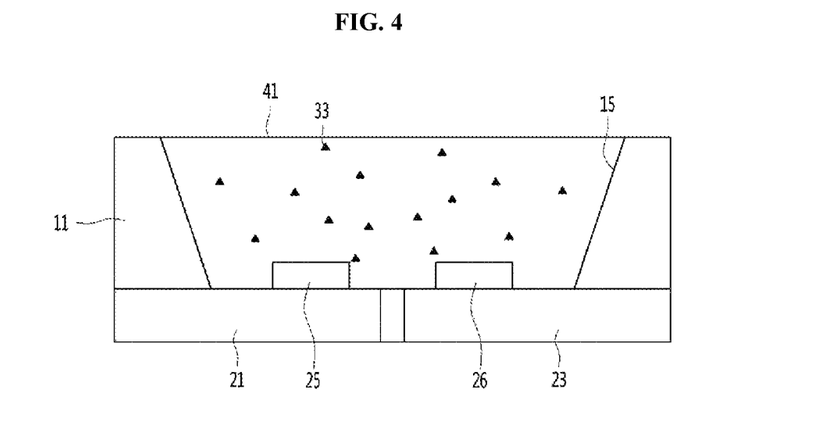
FIG. 4 is a view showing another example of a light emitting device having a red phosphor according to an embodiment.

FIG. 4 is a view showing another example of a light emitting device having a red phosphor according to an embodiment. In describing FIG. 4, the same configuration as the above embodiment can be selectively applied with reference to the above-described description.

FIG. 4, the light emitting device includes a molding member 41 having a body 11, a plurality of lead frames 21 and 23, light emitting chips 25 and 26, and a red phosphor 33.

The light emitting chips 25 and 26 may include a light emitting chip 25 that emits blue light and a light emitting chip 26 that emits green light. The blue light emitting chip 25 and the green light emitting chip 26 may be connected in parallel to each other or may be connected in series to each other. However, the present invention is not limited thereto. The blue light emitting chip 25 and the green light emitting chip 26 may be disposed on the same one lead frame or on different lead frames, but the present invention is not limited thereto. The red phosphor 33 is a phosphor according to an embodiment, and reference is made to the description given above. The light emitting device according to the embodiment may include a blue light emitting chip 25, a green light emitting chip 26, and a red phosphor 33, and may be realized as a white light emitting device. The light emitting device according to the embodiment has a higher color reproduction rate and a color reproduction ratio equal to that of the case of using a red/green/blue chip, compared with a configuration using a yellow phosphor or a phosphor that emits a peak wavelength at a lower red wavelength can be provided, and in particular, a darker and brighter red color can be provided.

Figure 5:
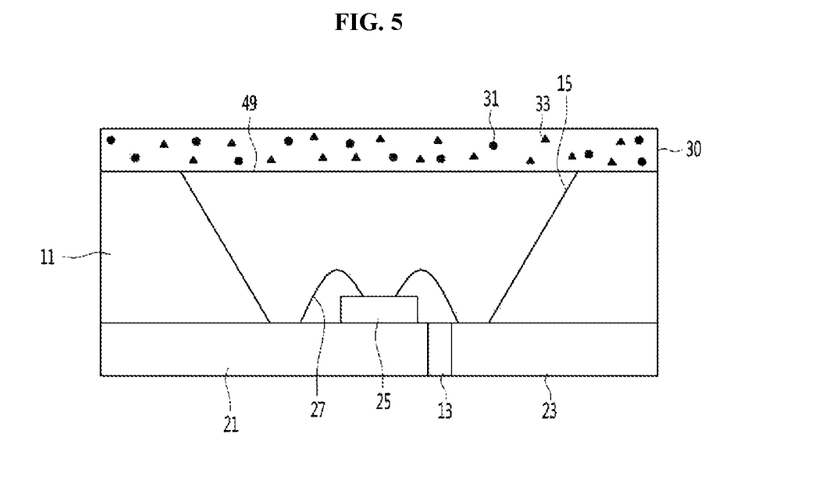
FIG. 5 is a view showing a light emitting device having a film to which a red phosphor is added according to an embodiment.

FIG. 5 is a view showing another example of a light emitting device having a phosphor according to an embodiment. In describing FIG. 5, the same configuration as that of the above embodiment can be selectively applied with reference to the above-described description.

FIG. 5, the light emitting device may include a molding 49 in the cavity 15 of the body 11 and a film 30 having the phosphors 31 and 33 on the body 11.

Any kind of phosphor may not be added to the molding member 49. Accordingly, the influence of the heat generated from the light emitting chip 25 on the phosphors 31 and 33 can be reduced.

The film 30 is a transparent film and includes a resin material such as silicone or epoxy. The contents of the phosphors 31 and 33 in the film 30 will be described with reference to the description of the embodiments disclosed above. The film 30 may include a glass material coated on the upper surface and/or the lower surface of the phosphors 31 and 33. The film 30 may have an area larger than the area of the upper surface of the molding member 49, thereby improving the wavelength conversion efficiency of the phosphors 31 and 33 therein. The film 30 can be fixed in contact with the exit surface of the molding member 49. The width of the film 30 may be narrower than the sum of the widths of the lead frames 21 and 23 at the side end surfaces thereof and narrower than the width of the body 11. There is a problem that light loss may occur when a part of the film 30 is exposed to the outside of the body 11. The film 30 may be adhered to the upper surface of the body 11 with an adhesive. The thickness of the film 30 may be equal to or less than the thickness of the molding member 49. The width direction of the film 30 may be a direction in which the first and second lead frames 21 and 23 are arranged.

The phosphors 31 and 33 may include first and second phosphors 31 and 33 that emit different peak wavelengths. The first and second phosphors 31 and 33 will be described with reference to the description of the embodiment. The first and second phosphors 31 and 33 are spaced apart from the light emitting chip 25 so that the wavelength of the light emitted through the emitting surface of the molding member 49 can be changed.

Figure 6:
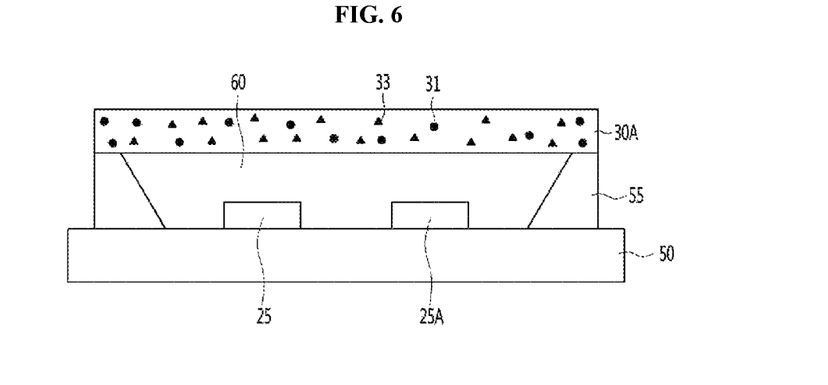
FIG. 6 is a view showing a light unit having a film to which a red phosphor is added according to the embodiment.

FIG. 6 is a view showing a light unit having a phosphor according to an embodiment.

FIG. 6, one or a plurality of light emitting chips 25 and 25A are disposed on a circuit board 50, a reflective member 55 is disposed around the light emitting chips 25 and 25A, a film 30A having phosphors 31 and 33 may be disposed on the light emitting chips 25 and 25A. The width of the film 30A may be wider than the area 60 between the reflecting members 55 at the side end face and may be narrower than the width of the reflecting member 55. If the width of the film 30A is larger than the width of the reflective member 55, the film 30A may be exposed to the outside and light loss may occur. The thickness of the film 30A may be smaller than the thickness of the reflective member 55. The width direction of the film 30A may be a direction in which the light emitting chips 25 and 25A are arranged.

The circuit board 50 may have a circuit pattern and be electrically connected to the light emitting chips 25 and 25A. When a plurality of light emitting chips 25 and 25A are disposed on the circuit board 50, the plurality of light emitting chips 25 and 25A may be connected in series or in parallel.

The circuit board 50 may be a printed circuit board (PCB) including a circuit pattern (not shown). However, the circuit board 50 may include not only a general PCB but also a metal core PCB (MCPCB), a flexible PCB (FPCB), and the like, but the present invention is not limited thereto. A reflective material is disposed on the upper surface of the circuit board 50 to reflect light.

The reflective member 55 may include a reflective material, for example, a silicone-based material, an epoxy-based material, or a plastic material, and may be formed of a thermosetting resin or a material having high heat resistance and high light resistance. Also, the reflective member 55 may be selectively added with an acid anhydride, an antioxidant, a release agent, a light reflector, an inorganic filler, a curing catalyst, a light stabilizer, a lubricant, and titanium dioxide. The reflection member 55 may be disposed on the outer periphery of the light emitting chips 25 and 25A to reflect light emitted from the light emitting chips 25 and 25A.

The region 60 between the circuit board 50 and the film 30A is a transparent region and can be formed of a material that transmits light. The light-transmitting material may be air or a resin material such as silicone or epoxy. The film 30A may be disposed on the transparent region 60. The film 30A may be in contact with the resin material when the transparent region 60 is filled with the resin material.

The film 30A is a transparent film and includes a resin material such as silicone or epoxy. The film 30A may include a glass material on which the phosphors 31 and 33 are applied above and/or below. The film 30A can be further extended on the reflective member 55 to improve the wavelength conversion efficiency of the phosphors 31 and 33 therein.

The light emitting chips 25 and 25A may emit at least one of ultraviolet light and blue light. The phosphors 31 and 33 include first and second phosphors 31 and 33 and the first and second phosphors 31 and 33 may include the phosphors disclosed in the embodiments.

Figure 7:
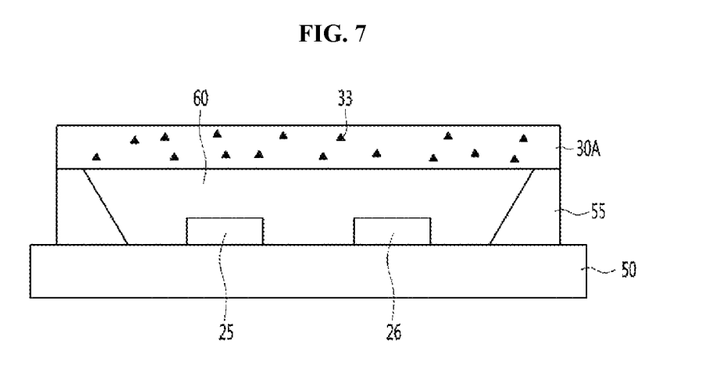
FIG. 7 is a view showing another example of a light unit having a film to which a red phosphor is added according to the embodiment.

FIG. 7 is a view showing a light unit having a red phosphor according to an embodiment.

FIG. 7, one or a plurality of light emitting chips 25 and 26 are disposed on a circuit board 50, a reflective member 55 is disposed around the light emitting chips 25 and 26, And a film 30A having a red phosphor 33 on the light emitting chips 25 and 26 may be disposed.

The light emitting chips 25 and 26 may include a light emitting chip 25 for emitting blue light and a light emitting chip 26 for emitting green light. The phosphor 33 emits red light with blue light emitted from the light emitting chip 25 as an excitation wavelength, and may include a red phosphor according to an embodiment. The light unit includes white light emitting chips 25 and 26 and red phosphors 33 that emit different colors, and can provide white light. The light unit according to the embodiment has a high color reproduction rate and a color reproduction ratio equal to that of the case of using a red/green/blue chip, compared with a configuration using a yellow phosphor or a phosphor that emits a peak wavelength at a low red wavelength Can be provided, and in particular, a darker and brighter red color can be provided.

On the molding member or film according to the embodiment, an optical lens for changing the directivity angle of light may be disposed. The optical lens can change the path of the light emitted through the molding member or the film, and radiate in a desired directional angle distribution.

<Lighting System>

The light emitting device or the light unit according to the embodiment can be applied to the illumination system. The illumination system includes a structure in which a plurality of light emitting devices are arrayed and includes a display device shown in FIGS. 11 and 12, a lighting device shown in FIG. 13, and may include an illumination lamp, a traffic light, a vehicle headlight, have.

Figure 11:
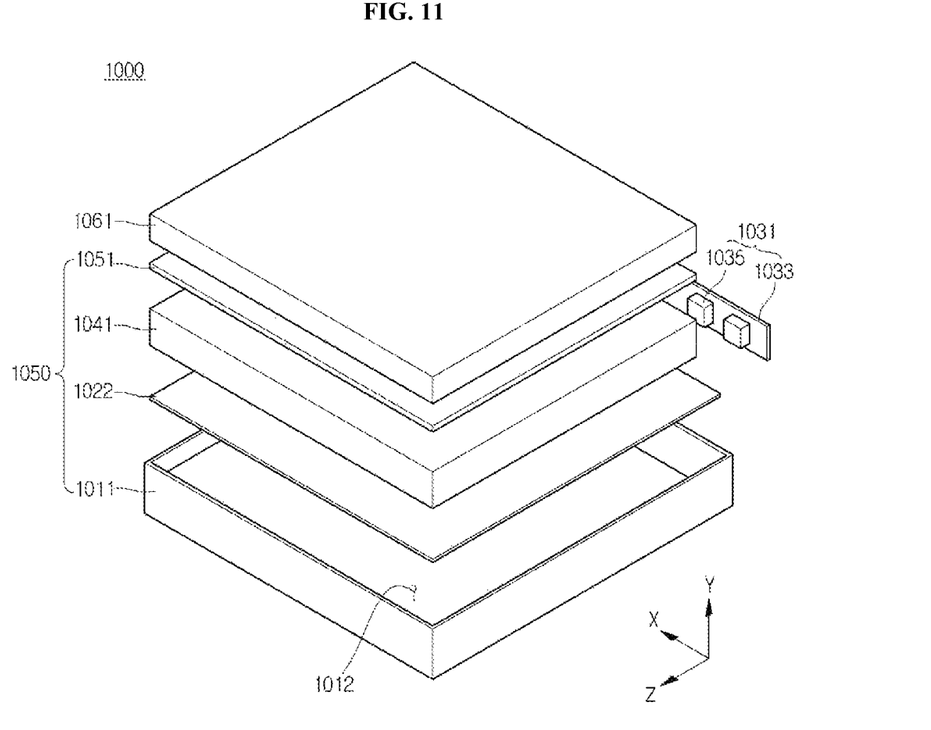
FIG. 11 is a perspective view showing a display device having a light emitting device according to an embodiment.

FIG. 11 is an exploded perspective view of a display device having a light emitting device according to an embodiment.

FIG. 11, a display device 1000 according to an embodiment includes a light guide plate 1041, a light source module 1031 for providing light to the light guide plate 1041, and a reflection member 1022, an optical sheet 1051 on the light guide plate 1041, a display panel 1061 on the optical sheet 1051, the light guide plate 1041, a bottom cover 1011 receiving the light source module 1031 and the reflection member 1022, but it is not limited thereto.

The bottom cover 1011, the reflective sheet 1022, the light guide plate 1041, and the optical sheet 1051 can be defined as a light unit 1050.

The light guide plate 1041 serves to diffuse light into a surface light source. The light guide plate 1041 may be made of a transparent material such as acrylic resin such as polymethyl methacrylate (PET), polyethylene terephthalate (PET), polycarbonate (PC), cycloolefin copolymer (COC), and polyethylene naphthalate (PEN) resin.

The light source module 1031 provides light to at least one side of the light guide plate 1041, and ultimately acts as a light source of the display device. The light source module 1031 includes at least one light source module 1031 and may directly or indirectly provide light from one side of the light guide plate 1041. The light source module 1031 includes a substrate 1033 and a light emitting device 1035 according to the embodiment described above and the light emitting devices 1035 may be arrayed on the circuit substrate 1033 at predetermined intervals.

The circuit board 1033 may be a printed circuit board (PCB) including a circuit pattern (not shown). However, the substrate 1033 may include not only a general PCB but also a metal core PCB (MCPCB), a flexible PCB (FPCB), and the like, but the present invention is not limited thereto. When the light emitting device 1035 is mounted on the side surface of the bottom cover 1011 or on the heat radiation plate, the circuit board 1033 can be removed. Here, a part of the heat dissipation plate may contact the upper surface of the bottom cover 1011.

The plurality of light emitting devices 1035 may be mounted on the circuit board 1033 such that the light emitting surface of the plurality of light emitting devices 1035 is spaced apart from the light guiding plate 1041 by a predetermined distance. The light emitting device 1035 may directly or indirectly provide light to the light-incident portion, which is one surface of the light guide plate 1041, but is not limited thereto.

The reflective member 1022 may be disposed under the light guide plate 1041. The reflection member 1022 reflects the light incident on the lower surface of the light guide plate 1041 so as to face upward, thereby improving the brightness of the light unit 1050. The reflective member 1022 may be formed of, for example, PET, PC, or PVC resin, but is not limited thereto. The reflecting member 1022 may be the upper surface of the bottom cover 1011, but is not limited thereto.

The bottom cover 1011 may receive the light guide plate 1041, the light source module 1031, the reflective member 1022, and the like. To this end, the bottom cover 1011 may be provided with a receiving portion 1012 having a box-like shape with an opened top surface, but the present invention is not limited thereto. The bottom cover 1011 may be coupled to the top cover, but is not limited thereto.

The bottom cover 1011 may be formed of a metal material or a resin material, and may be manufactured using a process such as press molding or extrusion molding. In addition, the bottom cover 1011 may include a metal or a non-metal material having good thermal conductivity, but the present invention is not limited thereto.

The display panel 1061 is, for example, an LCD panel, including first and second transparent substrates facing each other, and a liquid crystal layer interposed between the first and second substrates. A polarizing plate may be attached to at least one surface of the display panel 1061, but the present invention is not limited thereto. The display panel 1061 displays information by light passing through the optical sheet 1051. Such a display device 1000 can be applied to various kinds of portable terminals, monitors of notebook computers, monitors of laptop computers, televisions, and the like.

The optical sheet 1051 is disposed between the display panel 1061 and the light guide plate 1041 and includes at least one light transmitting sheet. The optical sheet 1051 may include at least one of a sheet such as a diffusion sheet, a horizontal and vertical prism sheet, and a brightness enhancement sheet. The diffusion sheet diffuses incident light. The horizontal or/and vertical prism sheet condenses incident light into a display area. The brightness enhancing sheet enhances brightness by reusing the lost light. A protective sheet may be disposed on the display panel 1061, but the protective sheet is not limited thereto.

Here, the optical path of the light source module 1031 may include the light guide plate 1041 and the optical sheet 1051 as an optical member, but the invention is not limited thereto.

Figure 12:
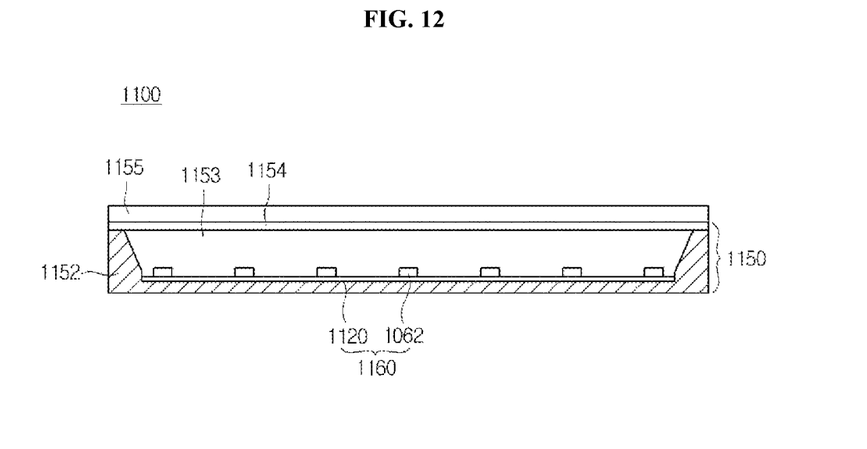
FIG. 12 is a perspective view showing a display device having a light emitting device according to an embodiment.

FIG. 12 is a view showing a display device having a light emitting device according to an embodiment.

FIG. 12, the display device 1100 includes a bottom cover 1152, a circuit board 1120 on which the above-described light emitting device 1124 is arrayed, an optical member 1154, and a display panel 1155.

The circuit board 1120 and the light emitting device 1124 may be defined as a light source module 1160. The bottom cover 1152, the at least one light source module 1160, and the optical member 1154 may be defined as a light unit 1150. The bottom cover 1152 may include a receiving portion 1153, but the present invention is not limited thereto. The light source module 1160 includes a circuit board 1120 and a plurality of light emitting devices 1062 arranged on the circuit board 1120.

Here, the optical member 1154 may include at least one of a lens, a light guide plate, a diffusion sheet, a horizontal and vertical prism sheet, and a brightness enhancement sheet. The light guide plate may be made of PC material or PMMA (poly methyl methacrylate), and the light guide plate may be removed. The diffusion sheet diffuses incident light. The horizontal and vertical prism sheets condense incident light into a display area. The brightness enhancing sheet improves the brightness by reusing the lost light.

The optical member 1154 is disposed on the light source module 1160 and performs surface light source, diffusion, and light condensation on the light emitted from the light source module 1160.

Figure 13:
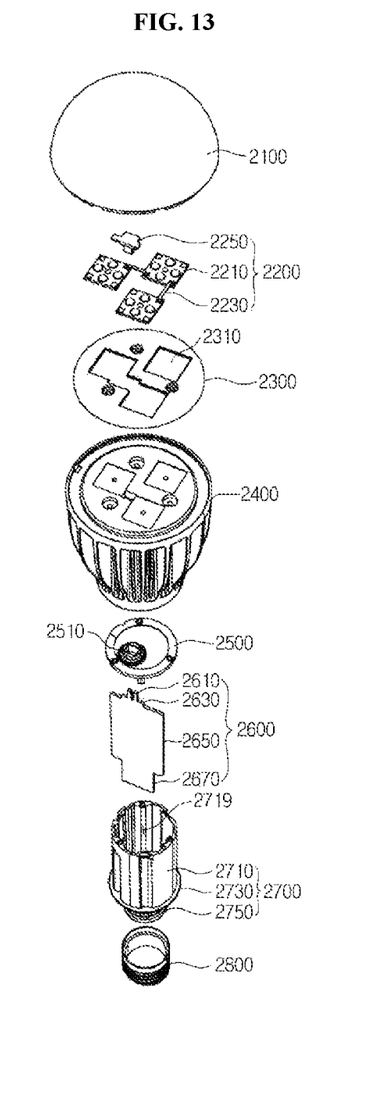
FIG. 13 is an exploded perspective view showing a lighting device having a light emitting device according to an embodiment.

FIG. 13 is an exploded perspective view of a lighting apparatus having a light emitting device according to an embodiment.

FIG. 13, the lighting apparatus according to the embodiment includes a cover 2100, a light source module 2200, a heat discharger 2400, a power supply unit 2600, an inner case 2700, and a socket 2800. Further, the illumination device according to the embodiment may further include at least one of the member 2300 and the holder 2500. The light source module 2200 may include a light emitting device according to an embodiment.

For example, the cover 2100 may have a shape of a bulb or a hemisphere, and may be provided in a shape in which the hollow is hollow and a part is opened. The cover 2100 may be optically coupled to the light source module 2200 and may be coupled to the heat discharger 2400. The cover 2100 may have an engaging portion that engages with the heat discharging body 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may be made of glass, plastic, polypropylene (PP), polyethylene (PE), polycarbonate (PC), or the like. Here, polycarbonate is excellent in light resistance, heat resistance and strength. The cover 2100 may be transparent so that the light source module 2200 is visible from the outside, and may be opaque. The cover 2100 may be formed by blow molding.

The light source module 2200 may be disposed on one side of the heat discharging body 2400. Accordingly, the heat from the light source module 2200 is conducted to the heat discharging body 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks the receiving groove 2719 of the insulating portion 2710 of the inner case 2700. Therefore, the power supply portion 2600 housed in the insulating portion 2710 of the inner case 2700 is sealed. The holder 2500 has a guide protrusion 2510. The guide protrusion 2510 may have a hole through which the protrusion 2610 of the power supply portion 2600 passes. The lower portion of the heat discharging body 2400 may be in close contact with the supporting portion 2370 of the inner case 2700.

The power supply portion 2600 processes or converts an electrical signal provided from the outside and provides the electrical signal to the light source module 2200. The power supply portion 2600 is housed in the receiving groove 2719 of the inner case 2700 and is sealed inside the inner case 2700 by the holder 2500.

The power supply portion 2600 may include a protrusion 2610, a guide portion 2630, a base 2650, and an extension portion 2670.

The guide portion 2630 has a shape protruding outward from one side of the base 2650. The guide portion 2630 may be inserted into the holder 2500. A plurality of parts may be disposed on one side of the base 2650. The plurality of components may include, for example, a DC converter, a driving chip for controlling driving of the light source module 2200, an electrostatic discharge (ESD) protection device for protecting the light source module 2200, the present invention is not limited thereto.

The extending portion 2670 has a shape protruding outward from the other side of the base 2650. The extension portion 2670 is inserted into the connection portion 2750 of the inner case 2700 and receives an external electrical signal. For example, the extension portion 2670 may be provided to be equal to or smaller than the width of the connection portion 2750 of the inner case 2700. The extension 2670 may be electrically connected to the socket 2800 through a wire.

The inner case 2700 may include a molding part together with the power supply part 2600. The molding part is a part where the molding liquid is hardened, so that the power supply part 2600 can be fixed inside the inner case 2700.

In the display device or the illumination system according to the embodiment, the color purity of red can be shifted to a more magenta color by including the red phosphor disclosed in the embodiment, so that the color reproduction ratio in the lighting or display device can be improved.

The features, structures, effects and the like described in the embodiments are included in at least one embodiment and are not necessarily limited to one embodiment. Furthermore, the features, structures, effects and the like illustrated in the embodiments can be combined and modified by other persons skilled in the art to which the embodiments belong. Accordingly, the contents of such combinations and modifications should be interpreted as being included in the scope of the embodiments.

Although described with reference to the embodiment above, this is not intended to limit the embodiment merely an example, if the embodiments those skilled in the Field of the various non-illustrated above without departing from the cases the essential characteristics of this embodiment kind of it will be apparent to the possible variations and applications. For example, each of the components specifically shown in the embodiment is capable of performing the transformation. And differences relating to these modifications and applications will have to be construed as being included in the scope of the embodiments set out in the appended claims.

INDUSTRIAL APPLICABILITY

The present invention can be applied to various light source systems in a light emitting device having a red phosphor.

The present invention can be applied to a display device or a lighting device using a light emitting device capable of reproducing a high color.

The present invention can be applied to a display device or a lighting device by using a light emitting device having improved color reproduction rate.

What is claimed is:

1. A phosphor comprising:
   a phosphor composition of a $M_4D_{1-x}O_yF:A_x$ structure containing a divalent metal (M), an elements (A) of the active agent, a fluorine or fluor (F) and an oxygen (O), and,
   wherein the x satisfies a range of 0.001≤x≤0.1, and the y satisfies a range of 1≤y≤5,
   wherein the M is at least one of Mg, Ca, Sr, Ba and Zn,
   wherein the D is at least one of Si, Ge, Sn, Ti, Zr and Hf,
   wherein the F is fluorine,
   wherein the A comprises at least one of Mn, Ce, Pr, Nd, Sm, Eu, Tb, Dy, Ho, Er, Tm, and Yb,
   wherein the phosphor composition emits red light by a peak wavelength of 400 nm to 470 nm as an excitation wavelength, and
   wherein the red light has a peak wavelength of 655 nm to 670 nm and has a FWHM of less than 20 nm.

2. The phosphor of claim 1, wherein the M is Mg, and wherein the D is Ge, and wherein the A comprises Mn, wherein the Mn includes $Mn^{4+}$ of tetravalent manganese.

3. The phosphor of claim 1, wherein the FWHM of the phosphor has a 10 nm to 20 nm.

4. A phosphor comprising: a structure of composition of $Mg_4Ge_{1-x}O_yF:Mn^{4+}{}_x$,
   wherein the x satisfies a range of 0.001≤x≤0.1, and the y satisfies a range of 1≤y≤5,
   wherein the composition has a peak wavelength of 655 nm to 670 nm, and has a FWHM of less than 20 nm.

5. A light emitting device comprising:
   a light emitting chip;
   a first phosphor that emits light of the first peak wavelength by a light emitted from the light emitting chip as an excitation wavelength;
   a second phosphor that emits light from the second peak wavelength by the light emitted from the light emitting chip as an excitation wavelength,
   wherein the first and second peak wavelengths have a different color,
   wherein the second phosphor includes a phosphor composition of a $M_4D_{1-x}O_yF:A_x$ structure containing a divalent metal (M), an elements (A) of the active agent, a fluorine or fluor (F) and an oxygen (O), and,
   wherein the x satisfies a range of 0.001≤x≤0.1, and the y satisfies a range of 1≤y≤5,
   wherein the M is at least one of Mg, Ca, Sr, Ba and Zn,
   wherein the D is at least one of Si, Ge, Sn, Ti, Zr and Hf,
   wherein the F is fluorine,
   wherein the A comprises at least one of Mn, Ce, Pr, Nd, Sm, Eu, Tb, Dy, Ho, Er, Tm, and Yb, and
   wherein the second peak wavelength emitted from the second phosphor has a peak wavelength of a of 400 nm to 470 nm and has a FWHM of less than 20 nm.

6. The light emitting device of claim 5, wherein the second phosphor includes a structure of composition of $Mg_4Ge_{1-x}O_yF:Mn^{4+}{}_x$.

7. The light emitting device of claim 5, wherein the first phosphor comprises a green phosphor.

8. The light emitting device of claim 5, wherein the light emitting chip emits a blue light or ultraviolet light.

9. The light emitting device of claim 8, wherein the FWHM has a range of 10 nm to 20 nm.

10. The light emitting device of claim 9, further comprising a molding member on the light emitting chip and a film on the molding member,
    wherein the first phosphor is disposed on the molding member, and
    the second phosphor is disposed in the film.

11. The light emitting device of claim 8, further comprising;
   a molding member or a film on the light emitting chip,
   wherein the first and second phosphors are disposed in the molding member or the film, and
   when a content ratio of the first and second phosphor is 100%, a content ratio of the second phosphor has a content ratio in the range 60% to 95% higher than a content ratio of the first phosphor.

12. The light emitting device of claim 11, further comprising: a plurality of lead frames electrically connected to the light emitting chip; and a body coupled to the plurality of lead frames and disposed around the light emitting chip, and
   wherein the film has the first and second phosphors and is disposed on the body.

13. The light emitting device of claim 11, further comprising: a plurality of lead frames electrically connected to the light emitting chip; and a body coupled to the plurality of lead frames and disposed around the light emitting chip, and
   wherein the molding member has the first and second phosphors and is disposed in the cavity of the body.

14. The light emitting device of claim 11, wherein a color coordinates of the second peak wavelength are arranged in a region where four points are connected, and
   wherein the four points are (0.5100, 0.4800), (0.5100, 0.5100), (0.5300, 0.4900) and (0.5300, 0.5055).

15. The light emitting device of claim 8, wherein the light emitting chip emits a peak wavelength of 400 nm to 470 nm.

* * * * *